(12) United States Patent
Matsubara

(10) Patent No.: US 7,626,862 B2
(45) Date of Patent: Dec. 1, 2009

(54) SEMICONDUCTOR MEMORY DEVICE

(75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 182 days.

(21) Appl. No.: 11/984,961

(22) Filed: Nov. 26, 2007

(65) Prior Publication Data

US 2008/0123463 A1    May 29, 2008

(30) Foreign Application Priority Data

Nov. 27, 2006    (JP)    ............... 2006-319349

(51) Int. Cl.
*G11C 11/34*    (2006.01)

(52) U.S. Cl. ............... 365/185.13; 365/230.06; 365/205

(58) Field of Classification Search ............ 365/185.13, 365/230.06, 205, 51, 63, 208, 190, 72, 230.03, 365/189.07, 189.05
See application file for complete search history.

(56) References Cited

U.S. PATENT DOCUMENTS

| 5,982,701 | A | 11/1999 | Eto |
| 7,075,852 | B2 | 7/2006 | Dono et al. |
| 7,184,538 | B1 | 2/2007 | Kobayashi et al. |
| 2005/0105322 | A1 | 5/2005 | Kobayashi et al. |
| 2005/0105372 | A1 | 5/2005 | Kanda |
| 2005/0169083 | A1* | 8/2005 | Riho et al. .................. 365/222 |
| 2005/0270889 | A1* | 12/2005 | Sekiguchi et al. ............ 365/232 |

FOREIGN PATENT DOCUMENTS

| JP | 10-112181 | 4/1998 |
| JP | 2005-135461 | 5/2005 |
| JP | 2005-158223 A | 6/2005 |

* cited by examiner

*Primary Examiner*—Dang T Nguyen
(74) *Attorney, Agent, or Firm*—Foley & Lardner LLP

(57) ABSTRACT

A semiconductor memory device comprises a memory cell array having a hierarchical word line structure including main word lines and sub-word lines; a main word driver for driving a non-selected main word line to high and for driving and activating a selected main word line to low; and a sub-word driver having a PMOS transistor whose gate is connected to the main word line for selectively activating the sub-word line corresponding to the selected main word line. The memory cell array is divided into a plurality of areas which is controlled such that a high level of each main word line is set to a first boost voltage in a predetermined area including the selected main word line, and a high level of each main word line is set to a second boost voltage lower than the first boost voltage in the other area.

7 Claims, 7 Drawing Sheets

SEMICONDUCTOR MEMORY DEVICE

BACKGROUND OF THE INVENTION

1. Field of the Invention

The present invention relates to a semiconductor memory device having P channel type MOS transistors, and particularly relates to a semiconductor memory device in which many sub-word drivers corresponding to a hierarchical word line structure are constituted by the P channel type MOS transistors.

2. Description of the Related Art

In a field of a DRAM (Dynamic Random Access Memory) serving as a large-capacity semiconductor memory device, suppressing leak current of a transistor has been demanded in accordance with miniaturization of process and lower voltage in recent years. Particularly, suppressing GIDL (Gate Induced Drain Leakage) current, which is included in the leak current, flowing through a P-channel MOS transistor (hereinafter referred to as a PMOS transistor) has been a problem.

FIG. 7 illustrates a state where the GIDL current occurs in a PMOS transistor. In FIG. 7, a cross-sectional structure corresponding to the PMOS transistor formed on a semiconductor substrate is shown, in which an N-well 100, a diffusion region 101 applied with a boost voltage VPP, a diffusion region 102 applied with a ground potential VSS, and a diffusion region 103 applied with a negative potential VKK are formed. Also, a gate electrode 105 applied with the boost voltage VPP is formed on between a drain and a source via a gate oxide film 104.

The N-well 100 is biased by the boost voltage VPP via the diffusion region 101, and the PMOS transistor is brought into an OFF state due to a potential relationship between the diffusion regions 102 and 103 and the gate electrode 105. On the other hand, if a depletion layer extends in a PN junction around the diffusion regions 102 and 103, an effect of impurity concentration causes GIDL current as the leak current to flow (arrows indicate the direction of electrons) near the surface of the depletion layer. The magnitude of the GIDL current changes exponentially relative to an electric field E generated at the gate oxide film 104, on the basis of the boost voltage VPP. In order to suppress the GIDL current, the electric field E needs to be reduced, and it is desirable to sufficiently reduce the boost voltage VPP for that purpose.

A typical DRAM includes many PMOS transistors each having the structure shown in FIG. 7. Particularly, in a DRAM having a hierarchical word line structure, many PMOS transistors are used in a sub-word driver for activating a sub-word line corresponding to a main word line (e.g., see Japanese Unexamined Patent Application Publication No. 2005-135461). In a large-capacity DRAM, the sum of GIDL currents flowing through the PMOS transistors of all sub-word drivers is too large to ignore. Particularly, in a mobile DRAM, the current needs to be sufficiently small in a standby state and thus the GIDL current needs to be adequately suppressed.

In the structure of the typical DRAM, the gate of each PMOS transistor of the sub-word driver is directly connected to a main word driver. On the other hand, as described above, it is difficult to suppress the boost voltage VPP such that the GIDL current can be ignored, due to restrictions of a circuit operation of the main word driver. Typically, when the main word line is in an inactive state, the boot voltage VPP is applied to gates of the PMOS transistors to bring them into an OFF state and thus the above-described effect of the GIDL current is inevitable. Particularly, in the mobile DRAM, it is a problem that the GIDL current accounts for a large proportion of the current flowing in the standby state, which hinders low-current operation. In FIG. 7, if a strong electric field E occurs at the gate oxide film 104 of the PMOS transistor, a decrease in reliability of the gate oxide film 104 is also a problem.

BRIEF SUMMARY OF THE INVENTION

An object of the present invention is to reduce GIDL current in many PMOS transistors in a semiconductor memory device, particularly to sufficiently reduce current flowing in many sub-word drivers to realize lower current in the entire semiconductor memory device, and furthermore to provide a semiconductor memory device capable of ensuring the structural reliability of the PMOS transistors.

An aspect of the present invention is a semiconductor memory device comprising: a memory cell array having a hierarchical word line structure including a plurality of main word lines and a plurality of sub-word lines; a main word driver for driving a non-selected main word line to a high level and for driving and activating a selected main word line to a low level; and a sub-word driver having at least a PMOS transistor to a gate of which the main word line is connected, said sub-word driver for selectively activating the sub-word line corresponding to the selected main word line, wherein said memory cell array is divided into a plurality of areas which is controlled such that a high level of each main word line is set to a first boost voltage in a predetermined area including the selected main word line, and a high level of each main word line is set to a second boost voltage lower than the first boost voltage in each area other than the predetermined area.

According to the semiconductor memory device of the present invention, the high level of the non-selected main word line is set to the first boost voltage in the predetermined area including the selected main word line, while the high level of the non-selected main word line is set to the second boost voltage lower than the first boost voltage in the other areas. Therefore, in each area other than the predetermined area, the voltage applied to the gate of the PMOS transistor of the input stage of the sub-word driver to which the main word line is connected can be reduced. Accordingly, an electric field generated at a gate oxide film can be reduced and the GIDL current can be suppressed, thereby effects of suppressing the GIDL current flowing in many sub-word drivers included in the semiconductor device can be accumulated so as to achieve lower current in the entire semiconductor memory device.

The semiconductor memory device of the present invention may further comprise a voltage switching circuit capable of selectively outputting the first boost voltage and the second boost voltage, in which the first boost voltages is supplied to said main word driver in the predetermined area, and the second boost voltage is supplied to said main word driver in each area other than the predetermined area.

In the present invention, the plurality of areas may be a plurality of memory mats into which said memory cell array is divided for every predetermined number of the main word lines.

In the present invention, said voltage switching circuit may be controlled such that the first and second boost voltages are selectively switched in response to a mat select signal for selecting the memory mat.

In the present invention, each of the memory mats may be divided into a plurality of sub mats for every predetermined number of the main word lines, and each of the sub mats may be arranged between sub-word driver groups each including a plurality of the sub-word drivers.

In the present invention, N sub-word lines may be formed corresponding to each of the main word lines, N sub-word drivers for activating the respective sub-word lines may be provided, and one of the sub-word drivers may be selectively driven in response to sub-word select signals different from one anther.

The present invention may further comprise a driver circuit for selectively activating N sub-word select signals supplied to the N sub-word drivers, in which one of the N sub-word select signals output from said driver circuit is coupled to one end of the PMOS transistor included in each of the sub-word drivers.

As described above, according to the present invention, a configuration is employed in which the gate level of the PMOS transistor of the sub-word driver in a non-selected state can be suppressed by dividing the memory cell array into a plurality of areas and switching the high level of the main word lines. Thus, the GIDL current can be reduced by reducing the electric field of the gate oxide film of the PMOS transistor, and by suppressing the total GIDL current flowing in many sub-word drivers, lower current of the semiconductor memory device can be achieved. Particularly, by reducing the GIDL current in self refresh operation, the current in the semiconductor memory device during a standby state can be significantly reduced. Further, the reduction of the electric field in the PMOS transistor enables improvement of reliability of the gate oxide film.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Hereinafter, an embodiment of the present invention is described with reference to the drawings. In this embodiment, the description is given about a case where the present invention is applied to a DRAM having a hierarchical word line structure including a plurality of main word lines and a plurality of sub-word lines.

Figure 1:
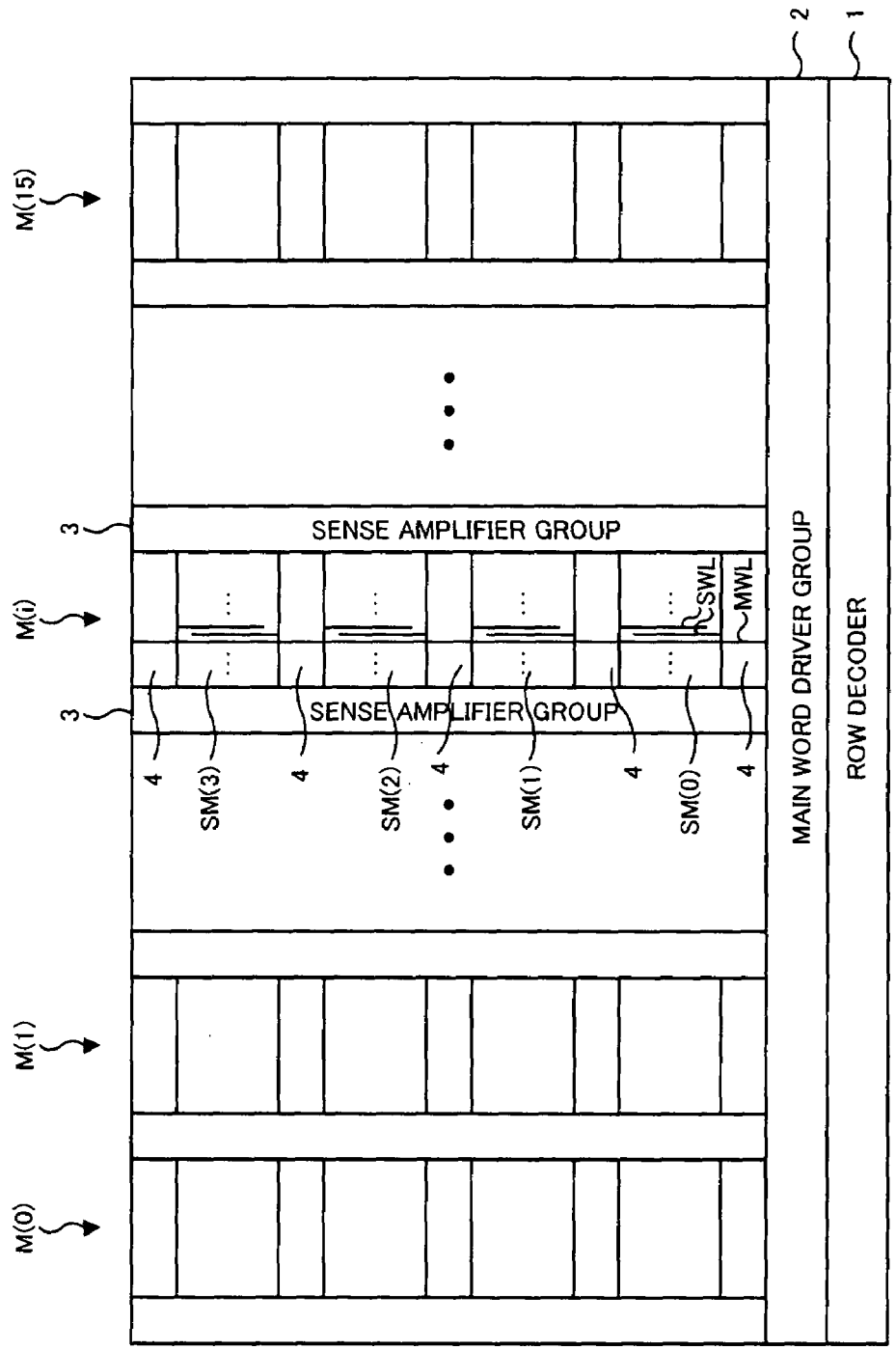
FIG. 1 is a block diagram showing an entire configuration of a DRAM of an embodiment.

FIG. 1 shows an entire configuration of the DRAM of the embodiment. As shown in FIG. 1, the DRAM of the embodiment includes a plurality of memory mats M into which a memory cell array including many memory cells is divided for every predetermined number of main word lines, a row decoder 1 for outputting a decode signal corresponding to the hierarchical word line structure based on an input row address, a main word driver group 2 including many main word drivers for activating main word lines selected by the row decoder 1, sense amplifier groups 3 each including many sense amplifiers for amplifying data read from the memory cells of each memory mat M, and sub-word driver groups 4 each including many sub-word drivers for selectively connecting a selected main word line to one of a predetermined number of sub-word lines. Each of the memory mats M is divided into a plurality of sub mats SM each including a predetermined number of bit lines sandwiched by the sub-word driver groups 4.

In the example shown in FIG. 1, the entire configuration includes sixteen memory mats M0 to M15, as indicated by numbers in parentheses of the memory mats M. Each memory mat M includes four sub mats SM(0) to SM(3), as indicated by numbers in parentheses in the i-th memory mat M(i). A main word lines MWL common to the four sub mats SM(0) to SM(3) extends from the main word driver group 2, and sub-word lines SWL extend in the respective sub mats SM. Each main word line MWL is connected to a predetermined number of sub-word lines SWL via the five sub-word driver groups 4 of the memory mat M.

When it is assumed that a row address is composed of thirteen bits, lower three bits of the row address are used to specify the sub-word line SWL and the other ten bits are used to specify the main word line MWL. In this case, 1024 main word lines MWL are provided in the entire configuration shown in FIG. 1, and 64 main word lines MWL are provided in each memory mat M. In each sub mat SM, the four sub-word lines SWL connected to one of the adjacent sub-word driver groups 4 and the four sub-word lines SWL connected to the other of the adjacent sub-word driver group 4 are alternately aligned for each single main word line MWL. Thus, when a row address is specified, one sub-word line SWL included in one of the sub-word driver groups 4 adjacent to the sub mat SM is selectively connected to an activated main word line MWL. In the memory mat M, four sub-word lines SWL, each of which is in each sub mat SM, are simultaneously activated with respect to the activated main word line MWL.

Two sense amplifier groups 3 are arranged on both sides in a bit line extending direction (an orthogonal direction to the word lines) of each memory mat M. Each sense amplifier group 3 sandwiched between two memory mats M is shared by these two memory mats M. Each sense amplifier included in the sense amplifier group 3 is connected to bit line pairs of the memory mats M on both sides, amplifies a minute potential of the bit line pair occurred due to charge of the memory cell, and outputs the amplified potential. Data from each sense amplifier is output to the outside through a select gate (not shown) corresponding to a column address. The same number of bit lines are arranged in the four sub mats SM respectively in each memory mat M.

Figure 2:
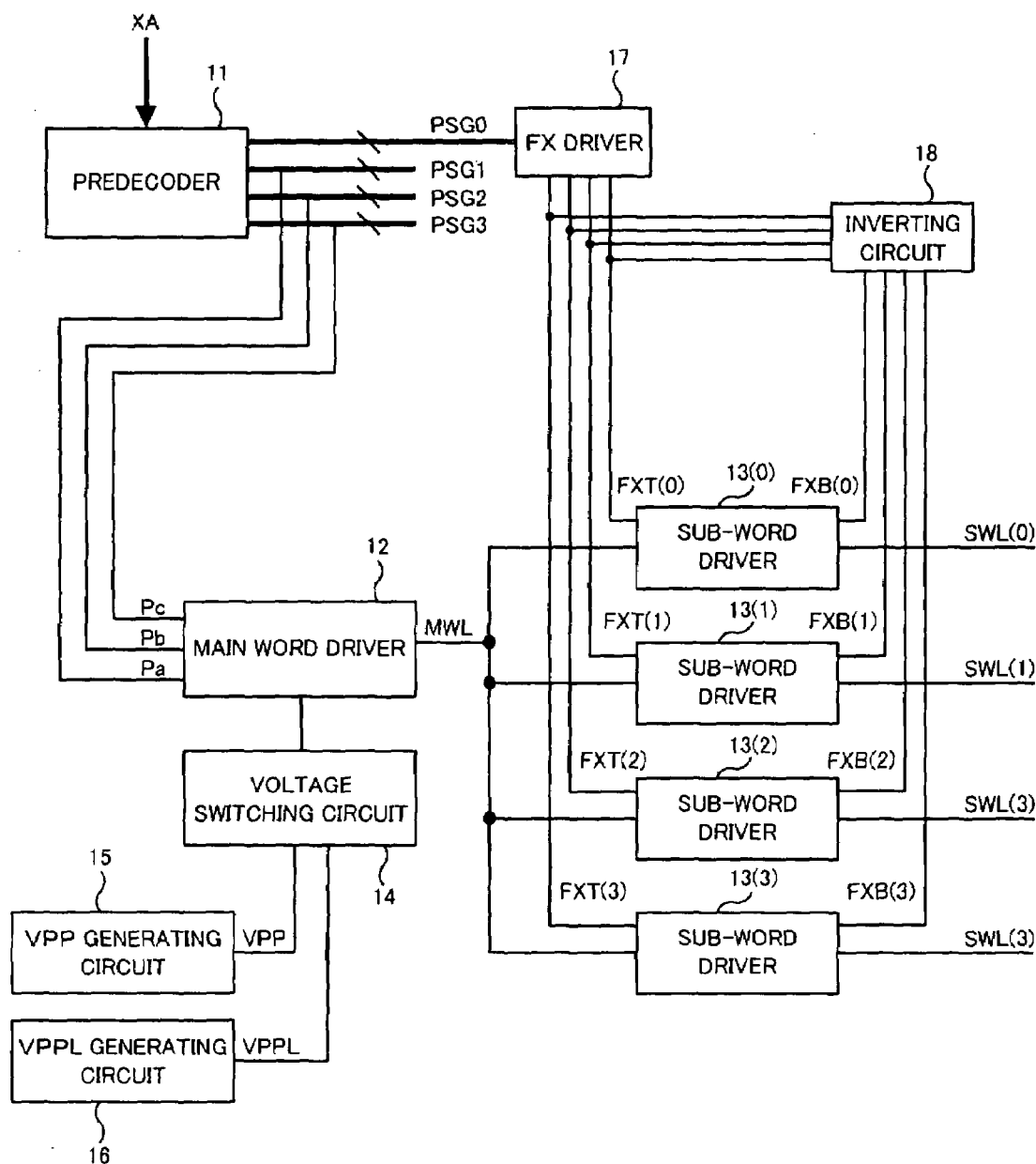
FIG. 2 is a block diagram showing a configuration of a main part of the DRAM of the embodiment.

FIG. 2 is a block diagram showing a configuration of a main part of the DRAM of the embodiment. The configuration shown in FIG. 2 includes a predecoder 11 included in the row decoder 1 of FIG. 1, a main word driver 12 included in the main word driver group 2 of FIG. 1, four sub-word drivers 13 included in the sub-word driver group 4 of FIG. 1 and arranged corresponding to one main word line MWL, a voltage switching circuit 14, a VPP generating circuit 15, a VPPL generating circuit 16, an FX driver 17, and an inverting circuit 18.

The predecoder 11 generates four predecode signal groups PSG0, PSG1, PSG2, and PSG3 based on an input row address XA. The thirteen bits included in the row address XA are assumed to be represented by X0 to X12. Then, the predecode signal group PSG0 includes eight signal lines decoded by lower three bits X0, X1, and X2, and is supplied to the FX driver 17. Meanwhile, the predecode signal group PSG1 includes eight signal lines decoded by the three bits X3, X4, and X5, the predecode signal group PSG2 includes eight signal lines decoded by the three bits X6, X7, and X8, and the predecode signal group PSG3 includes sixteen signal lines decoded by the four bits X9, X10, X11, and X12. One signal from each of the predecode signal groups PSG1, PSG2, and PSG3, that is, three decode signals Pa, Pb, and Pc in total, are supplied to the main word driver 12.

The main word line MWL extending from the main word driver 12 maintains a high level in an inactive state, but changes to a low level when being activated. When activating the main word line MWL, the predetermined row address XA corresponding to the main word driver 12 is specified, and all of the three decode signals Pa, Pb, and Pc are in an active state. The boost voltage to drive the main word driver 12 is supplied from the voltage switching circuit 14, and the high level of the main word line MWL is determined depending on this boost voltage.

The voltage switching circuit 14 selectively switches between the boost voltage VPP of a normal level (first boost voltage of the present invention) and a boost voltage VPPL of a lower level (second boost voltage of the present invention) in accordance with a selection state of the memory mat M to which the main word line MWL belongs, and supplies the voltage to the main word driver 12. Here, the voltage switching circuit 14 is controlled differently for each memory mat M, and thus needs to be independently provided for each memory mat M. The VPP generating circuit 15 generates the boost voltage VPP, while the VPPL generating circuit 16 generates the boost voltage VPPL, and these respective voltages are supplied to the voltage switching circuit 14. The voltage switching circuit 14 is switched to the boost voltage VPP when the memory mat M is selected, and is switched to the boost voltage VPPL when the memory mat M is not selected. The operation of the voltage switching circuit 14 is described in detail below.

The sub-word lines SWL extending from the sub-word drivers 13 have a polarity opposite to that of the main word line MWL. The sub-word lines SWL maintain a low level in an inactive state, but changes to a high level when being activated. When the main word line MWL is activated, one of the four sub-word lines SWL is selectively activated based on four sub-word select signals FXT. Thus, each of the sub-word drivers 13 is supplied with one of the four sub-word select signals FXT from the FX driver 17 and one of four inverted sub-word select signals FXB, which are generated by inverting the four sub-word select signals FXT by the inverting circuit 18.

The FX driver 17 includes four driver circuits for generating the four sub-word select signals FXT to be supplied to the four sub-word drivers 13 by using four of the eight signal lines of the predecode signal group PSG0. In addition, the other four signal lines of the predecode signal group PSG0 are used in the FX driver 17 corresponding to an adjacent sub-word driver group 4 via the sub mat SM. Meanwhile, the inverting circuit 18 generates the four inverted sub-word select signals FXB by inverting the four sub-word select signals FXT.

In FIG. 2, numbers are given in parentheses in order to indicate the relationship among the four sub-word lines SWL, the four sub-word drivers 13, the four sub-word select signals FXT, and the four inverted sub-word select signals FXB. Specifically, the figure shows the sub-word drivers 13(0) to 13(3), the sub-word lines SWL(0) to SWL(3), the sub-word select signals FXT(0) to FXT(3), and the inverted sub-word select signals FXB(0) to FXB(3).

The configuration of the four sub-word drivers 13 in FIG. 2 is repeatedly arranged in each of the sub-word driver groups 4 of FIG. 1. In this case, each sub-word driver group 4 is provided with 256 (64×4) sub-word drivers 13 for the 64 main word lines MWL connected to the 64 main word drivers 12 attached to each memory mat M, and the 256 sub-word drivers 13 are connected to 256 sub-word lines SWL in total.

Figure 3:
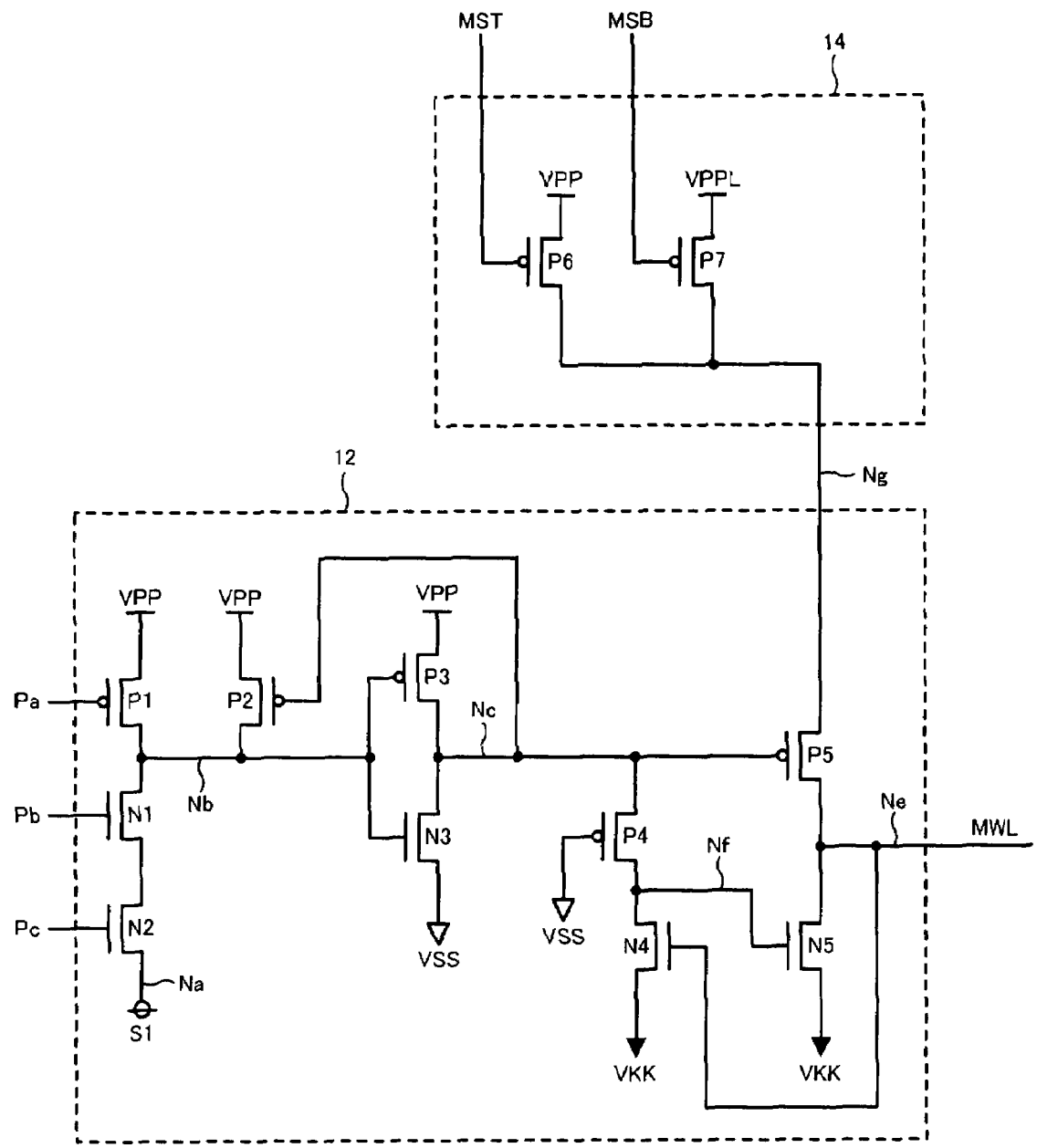
FIG. 3 is a diagram showing an example of a circuit configuration of a part including a main word driver and a voltage switching circuit of FIG. 2.

FIG. 3 shows an example of a circuit configuration of a part including the main word driver 12 and the voltage switching circuit 14 shown in FIG. 2. The main word driver 12 includes five PMOS transistors P1 to P5 and five NMOS transistors N1 to N5. A series circuit composed of the PMOS transistor P1 and the NMOS transistors N1 and N2 of the input stage is connected between the boost voltage VPP and a node Na. A control signal S1 is applied to the node Na, and the above-described decode signals Pa, Pb, and Pc are applied to the gates of the PMOS transistor P1 and the NMOS transistors N1 and N2, respectively. Further, the PMOS transistor P3 and the NMOS transistor N3 constituting an inverter are connected between the boost voltage VPP and the ground potential VSS, and the gates thereof are connected to a node Nb. Also, the PMOS transistor P2 is connected between the boost voltage VPP and the node Nb.

The PMOS transistor P4 and the NMOS transistor N4 are connected in series between a node Nc on the output side of the inverter and the negative potential VKK. The ground potential VSS is applied to the gate of the PMOS transistor P4, and the gate of the NMOS transistor N4 is connected to a node Ne. Further, the PMOS transistor P5 and the NMOS transistor N5 are connected in series between a node Nf on the output side of the voltage switching circuit 14 and the negative potential VKK. The gate of the PMOS transistor P5 is connected to the node Nc, and the gate of the NMOS transistor N5 is connected to a node Nd. The node Ne is connected to the main word line MWL.

In the above-described circuit configuration, in a state where the control signal S1 maintains in a low level, a low level is output to the node Nb for the pattern in which all of the decode signals Pa, Pb, and Pc are a high level, while a high level is output to the node Nb for the other patterns. The output of the node Nb is inverted by the inverter, and its voltage amplitude is converted by the PMOS transistors P4 and P5 and the NMOS transistors N4 and N5 of the subsequent stage. Thereby, the level at the node Ne is a high level of the boost voltage VPP or VPPL when the main word line MWL is not selected, and is a low level of the negative potential VKK when the main word line MWL is selected.

Meanwhile, the voltage switching circuit 14 includes a PMOS transistor P6 connected between the boost voltage VPP supplied from the VPP generating circuit 15 and the node Nf on the output side, and a PMOS transistor P7 connected between the boost voltage VPPL supplied from the VPPL generating circuit 16 and the node Nf on the output side. A mat select signal MST is applied to the gate of the PMOS transistor P6, while an inverted mat select signal MSB generated by inverting the mat select signal MST is applied to the gate of the PMOS transistor P7. The mat select signal MST is generated based on a bit group (e.g., the uppermost three bits) included in a row address corresponding to the specification of the memory mat M. The mat select signal MST goes high when the memory mat M to which the main word line MWL belongs is selected, and goes low when the memory mat M is not selected. The opposite occurs for the inverted mat select signal MSB.

Thus, when the memory mat M is selected, the PMOS transistor P6 is turned ON and the PMOS transistor P7 is turned OFF, so that the boost voltage VPP appears at the node Nf. In this case, the voltage amplitude at the time when the node Ne of the main word driver 12 is high is equal to the boost voltage VPP. On the other hand, when the memory mat M is not selected, the PMOS transistor P6 is turned OFF and the PMOS transistor P7 is turned ON, so that the boost voltage VPPL appears at the node Nf. In this case, the voltage amplitude at the time when the node Ne of the main word driver 12 is high is equal to the boost voltage VPPL. For example, in a case in which the level of the boost voltage VPP is set to 2.7 V and the level of the boost voltage VPPL is set to 2.2 V, the voltage difference between the selecting and non-selecting states of the memory mat M is 0.5 V.

Figure 4:
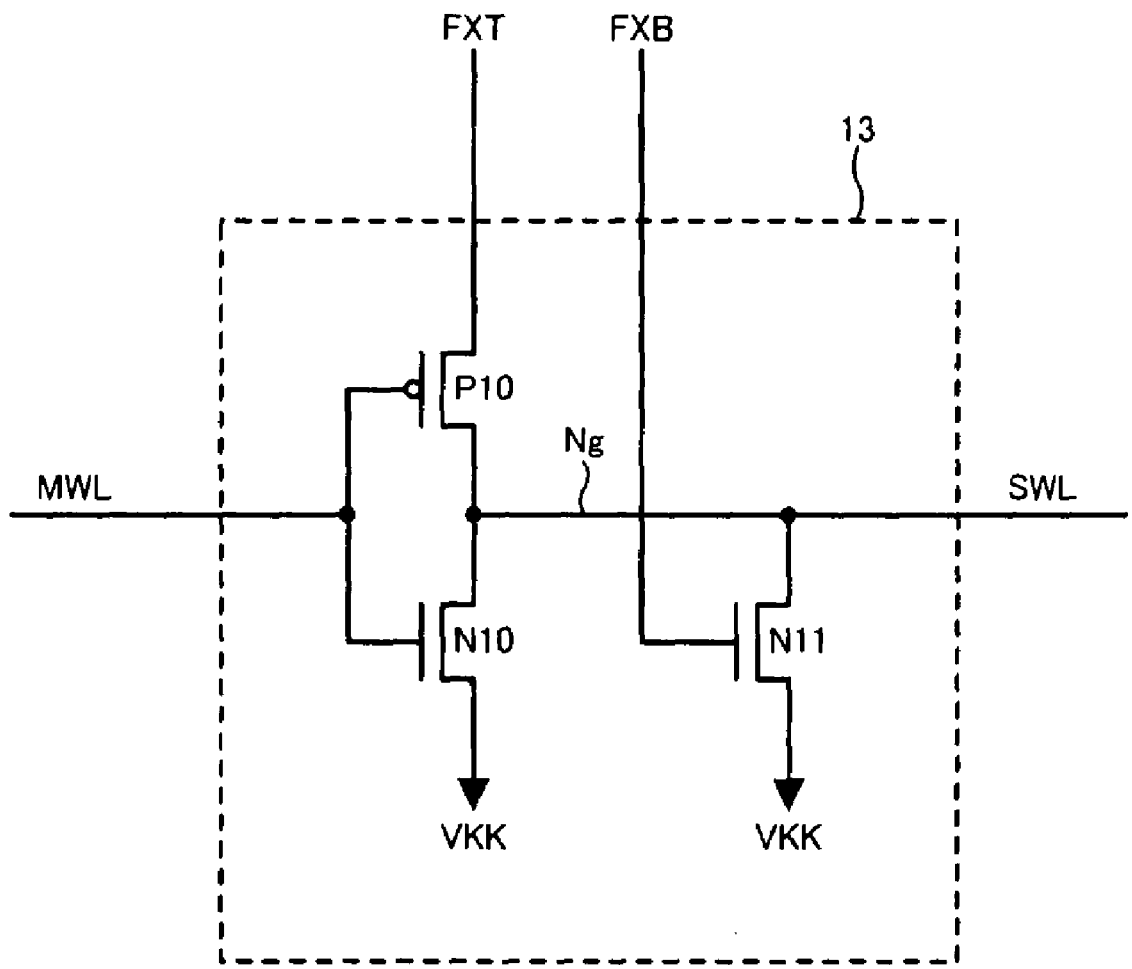
FIG. 4 is a diagram showing a circuit configuration of a sub-word driver of FIG. 2.

FIG. 4 shows a circuit configuration of the sub-word driver 13 shown in FIG. 2. Each of the four sub-word drivers 13 includes one PMOS transistor P10 and two NMOS transistors N10 and N11. The PMOS transistor P10 and the NMOS transistor N10 are connected in series between the corresponding sub-word select signal FXT and the negative potential VKK. The gates of the PMOS transistor P10 and the NMOS transistor N10 are connected to the main word line MWL. Meanwhile, the sub-word line SWL is connected to a node Ng between the PMOS transistor P10 and the NMOS transistor N10. The NMOS transistor N11 is connected between the node Ng and the negative potential VKK, and the inverted sub-word select signal FXB is applied to the gate of the NMOS transistor N11.

In the circuit configuration of FIG. 4, when the sub-word select signal FXT is in a state of being inactivated and low level, both the PMOS transistor P10 and the NMOS transistor N10 are in an OFF state, so that the main word line MWL and the sub-word line SWL are kept in a disconnected state. At this time, since the inverted sub-word select signal FXB is in a high level, the NMOS transistor N11 is turned ON and the node Ng on the output side is connected to the negative potential VKK. Thereby, the sub-word line SWL is kept in a low level without being brought into a floating state.

Meanwhile, when the sub-word select signal FXT is activated and goes high, an inverted signal of the main word line MWL is output to the node Ng by the inverter operation of the PMOS transistor P10 and the NMOS transistor N10. Thus, when the main word line MWL is activated and is in a low level, the sub-word line SWL is activated via the node Ng and the level thereof goes high. At this time, the inverted sub-word select signal FXB is in a low level, and thus the NMOS transistor N11 maintains in an OFF state. In this state, if the main word line MWL changes to high, the sub-word line SWL changes to low.

Figure 5:
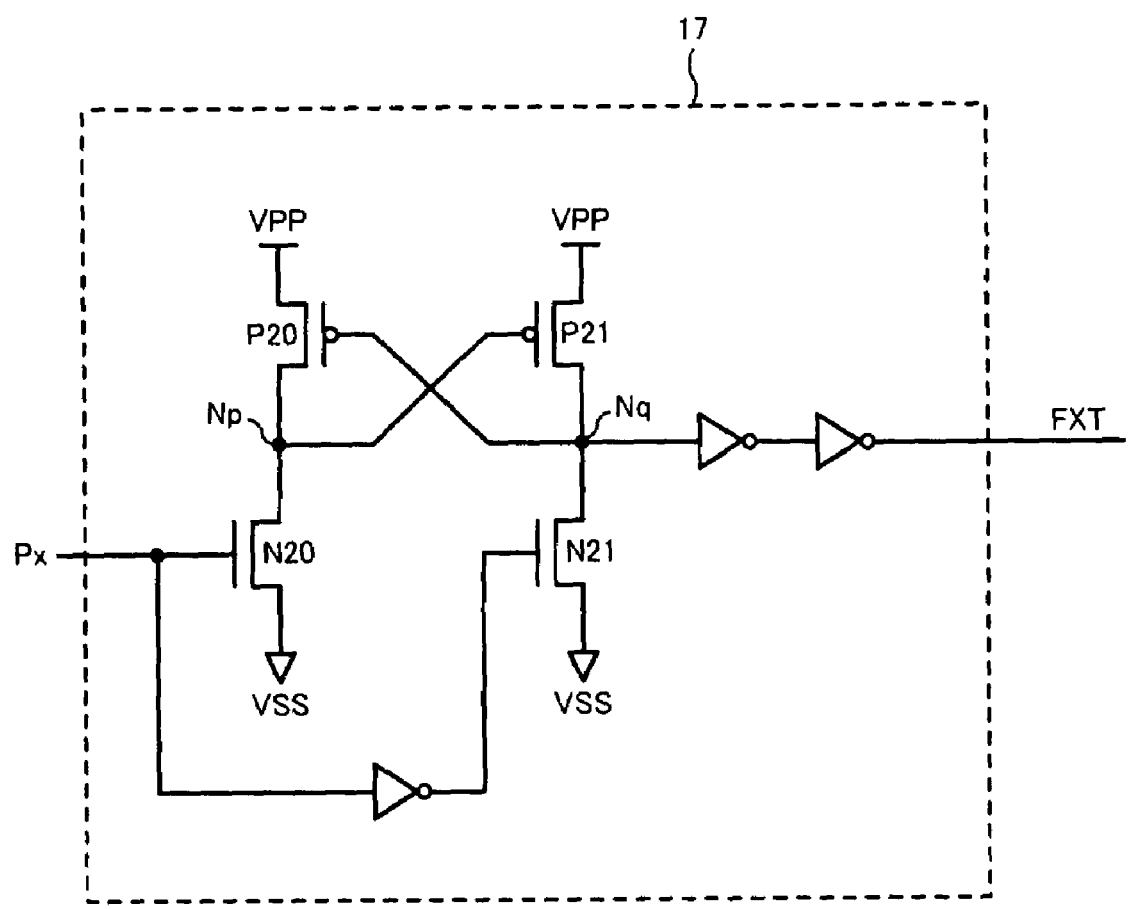
FIG. 5 is a diagram showing a circuit configuration of a FX driver of FIG. 2.

FIG. 5 shows a circuit configuration of the FX driver 17 shown in FIG. 2. Hereinafter, only a circuit portion for generating one sub-word select signal FXT is described. Actually, however, four circuit configurations of FIG. 5 for generating four sub-word select signals FXT are required. Referring to FIG. 5, a PMOS transistor P20 and an NMOS transistor N20 are connected in series and also a PMOS transistor P21 and an NMOS transistor N21 are connected in series, respectively, between the boost voltage VPP and the ground potential VSS. A node Np between the PMOS transistor P20 and the NMOS transistor N20 is connected to the gate of the PMOS transistor P21, and a node Nq between the PMOS transistor P21 and the NMOS transistor N21 is connected to the gate of the PMOS transistor P20.

In the configuration of FIG. 5, a predecode signal Px included in the predecode signal group PSG0 output from the predecoder 11 is applied to the gate of the NMOS transistor N20, and a signal generated by inverting the predecode signal Px by an inverter is applied to the gate of the NMOS transistor N21. Then, the signal at the node Nq is output as the sub-word select signal FXT via two inverters. In addition, the inverting circuit 18 for inverting the sub-word select signal FXT is constituted by a known inverter.

Figure 6:
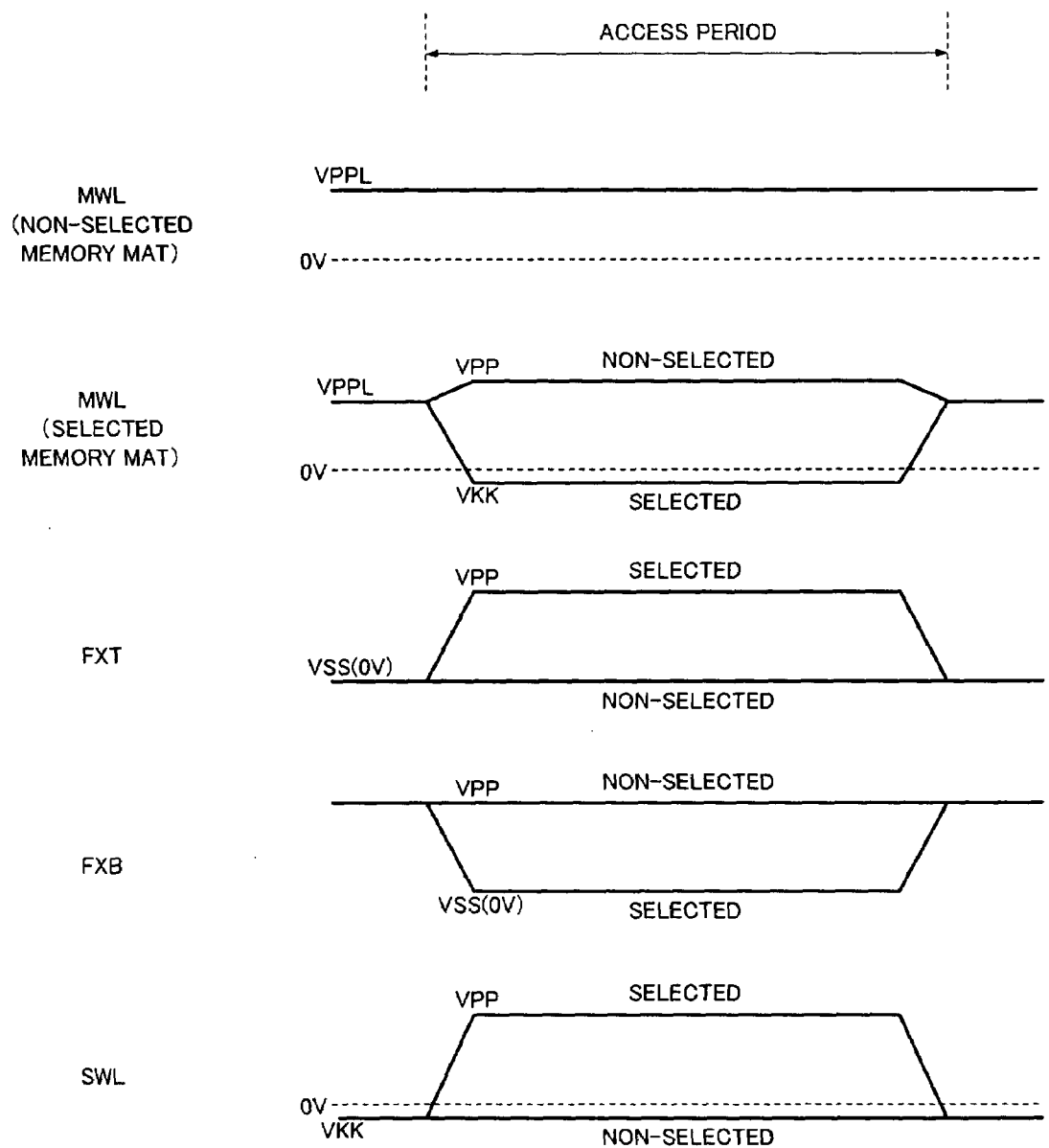
FIG. 6 is a diagram showing changes in waveforms compared with one another in the sub-word driver of FIG. 4 during an access period when a sub-word line is activated.

In the following, the operation of the sub-word driver 13 of FIG. 4 is described with reference to FIG. 6. FIG. 6 shows changes in waveforms compared with one another in each part of the sub-word driver 13 during an access period when one sub-word line SWL is activated. First, regarding the main word line MWL input to the sub-word driver 13, cases where the main word line MWL belongs to the memory mat M selected to be accessed and where the main word line MWL belongs to a non-selected memory mat M are compared. The level of the main word line MWL belonging to the non-selected memory mat M is constantly kept at the boost voltage VPPL during a given time including the access period due to the operation of the voltage switching circuit 14.

On the other hand, in the non-selected main word line MWL belonging to the selected memory mat M, the level thereof is kept at the boost voltage VPPL before the start of the access period. However, when the memory mat M is selected at the start of the access period, the switching operation of the voltage switching circuit 14 causes the level of the main word line MWL to change from the boost voltage VPPL to the boost voltage VPP. Meanwhile, the single main word line MWL that is selectively activated in the selected memory mat M is kept at the boost voltage VPPL before the start of the access period as in the above-described case, but the input of the main word driver 12 is inverted at the start of the access period, and the level of the main word line MWL changes from the boost voltage VPPL to the negative potential VKK. The levels of both the non-selected main word line MWL and the selected main word line MWL return to the level of the boost voltage VPPL when the voltage switching circuit 14 is switched to the original state at the end of the access period.

The sub-word select signal FXT is kept at the ground potential VSS before and after the access period. However, in the access period, one sub-word select signal FXT in the selected memory mat M is selectively activated. That is, in the access period, the non-selected sub-word select signal FXT is continuously kept at the ground potential VSS, and the level of the selected sub-word select signal FXT changes from the ground potential VSS to the boost voltage VPP. Further, the inverted sub-word select signal FXB changes with a polarity opposite to that of the waveform of the sub-word select signal FXT. In the access period, the level of the inverted sub-word select signal FXB corresponding to the selected sub-word select signal FXT changes from the boost voltage VPP to the ground potential VSS.

The sub-word line SWL is kept at the negative potential VKK before and after the access period. In the access period, one sub-word line SWL in the selected memory mat M is selectively activated. A non-selected sub-word line SWL is continuously kept at the negative potential VKK in the access period and before and after the access period. On the other hand, the selected sub-word line SWL changes from the negative potential VKK to the boost voltage VPP because the sub-word select signal FXT is activated at the start of the access period. The sub-word select signal FXT is inactivated at the end of the access period, and the sub-word line SWL returns to the original negative potential VKK.

Figure 7:
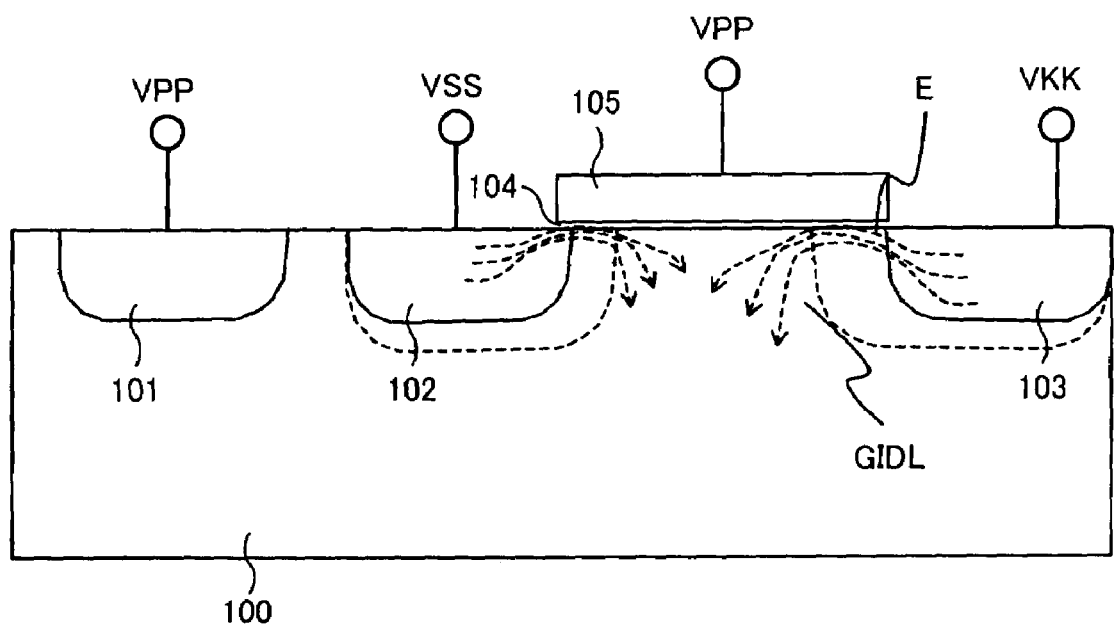
FIG. 7 is a diagram showing a state where GIDL current occurs in a PMOS transistor.

Here, an attention is focused on the PMOS transistor P10 of the sub-word driver 13. When the main word line MWL belonging to all the memory mats M is selected, the negative potential VKK is applied to the gate, and thus the electric field E is not generated at the gate oxide film 104 shown in FIG. 7. On the other hand, when the main word line MWL belonging to the selected memory mat M is not selected, the GIDL current flows due to the effect of the electric field E since the boost voltage VPP is applied to the gate of the PMOS transistor P10. In this case, the level of the sub-word select signal FXT connected to one end of the sub-word driver 13 to be driven becomes the boost voltage VPP, and which is also supplied to the other non-selected sub-word drivers 13 connected in common. In order to reliably turn OFF the PMOS transistor P10, it is desirable to apply a low-level boost voltage VPP to its gate.

On the other hand, regarding the main word line MWL (non-selected) belonging to the non-selected memory mat M, the boost voltage VPPL is applied to the gate of the PMOS transistor P10, as shown in FIG. 6. In this case, the sub-word select signal FXT connected to one end of each PMOS transistor P10 is kept at the ground potential VSS, and no problem occurs even if the level of the gate is lowered. Accordingly, compared to the case of the selected memory mat M, the boost voltage VPPL, which is set to a lower level than that of the boost voltage VPP, is applied to the gate of the PMOS transistor P10. Thereby, the electric field E generated at the gate oxide film 104 is reduced and the GIDL current can be reduced.

When it is assumed that the DRAM of the embodiment includes sixteen memory mats M in total, the GIDL current according to the electric field E flows through the PMOS transistor P10 in the selected memory mat M. On the other hand, in the other fifteen memory mats M, the GIDL current can be reduced by reducing the electric field E, and thus the GIDL current in the entire DRAM can be sufficiently suppressed. In this way, the GIDL current can be suppressed more effectively as the number of memory mats M into which the DRAM is divided is larger. Particularly, by applying this embodiment in self refresh operation of the DRAM, current consumption during a standby state can be significantly reduced.

As a result of actually applying the configuration of this embodiment to a typical DRAM, an effect of reducing the GIDL current has been actually confirmed. That is, in a mobile DRAM of 512 Mbits including sixteen memory mats M, the GIDL current flowing in the entire chip during the standby state is about 80 µA. On the contrary, when the configuration of this embodiment is applied by setting VPP=2.7 V and VPPL=2.2 V to the same type of DRAM, the GIDL current flowing in the entire chip during the standby state is about 20 µA. That is, the GIDL current can be nearly reduced by quarter. Further, it has been confirmed that high reliability can be ensured for the electric field E applied to the gate oxide film 104 of FIG. 7 by sufficiently reducing the electric field E with a large margin for an allowable range of 7.0 MV/cm.

In the foregoing, the present invention has been described in detail based on the embodiment. However, the present invention is not limited to the above-described embodiment and can be variously modified without deviating from the scope of the invention. For example, the setting of the values of the two boost voltages VPP and VPPL can be variously selected in accordance with a circuit configuration. Further, various configurations other than the configuration of the above-described embodiment can be adopted to switch the two boost voltages VPP and VPPL. Furthermore, the memory cell array needs not always be divided into a plurality of memory mats M for every predetermined number of main word lines, but the present invention can be applied as long as the memory cell array is divided into a plurality of areas.

The present invention is not limited to the above described embodiments, and various variations and modifications may be possible without departing from the scope of the present invention.

This application is based on the Japanese Patent application No. 2006-319349 filed on Nov. 27, 2006, entire content of which is expressly incorporated by reference herein.

What is claimed is:

1. A semiconductor memory device comprising:
    a memory cell array having a hierarchical word line structure including a plurality of main word lines and a plurality of sub-word lines;
    a main word driver for driving a non-selected main word line to a high level and for driving and activating a selected main word line to a low level; and
    a sub-word driver having at least a PMOS transistor to a gate of which the main word line is connected, said sub-word driver for selectively activating the sub-word line corresponding to the selected main word line,
    wherein said memory cell array is divided into a plurality of areas which is controlled such that a high level of each main word line is set to a first boost voltage in a predetermined area including the selected main word line, and a high level of each main word line is set to a second boost voltage lower than the first boost voltage in each area other than the predetermined area.

2. The semiconductor memory device according to claim 1 further comprising a voltage switching circuit capable of selectively outputting the first boost voltage and the second boost voltage,
    wherein the first boost voltages is supplied to said main word driver in the predetermined area, and the second boost voltage is supplied to said main word driver in each area other than the predetermined area.

3. The semiconductor memory device according to claim 2, wherein the plurality of areas is a plurality of memory mats into which said memory cell array is divided for every predetermined number of the main word lines.

4. The semiconductor memory device according to claim 3, wherein said voltage switching circuit is controlled such that the first and second boost voltages are selectively switched in response to a mat select signal for selecting the memory mat.

5. The semiconductor memory device according to claim 4, wherein each of the memory mats is divided into a plurality of sub mats for every predetermined number of the main word lines, and each of the sub mats is arranged between sub-word driver groups each including a plurality of the sub-word drivers.

6. The semiconductor memory device according to claim 1, wherein N (N is an integer equal to or greater than two) sub-word lines are formed corresponding to each of the main word lines, N sub-word drivers for activating the respective sub-word lines are provided, and one of the sub-word drivers is selectively driven in response to sub-word select signals different from one another.

7. The semiconductor memory device according to claim 6 further comprising a driver circuit for selectively activating N sub-word select signals supplied to the N sub-word drivers,
    wherein one of the N sub-word select signals output from said driver circuit is coupled to one end of the PMOS transistor included in each of the sub-word drivers.

* * * * *